United States Patent
Varadrajan et al.

(10) Patent No.: US 8,745,567 B1
(45) Date of Patent: Jun. 3, 2014

(54) EFFICIENT APPARATUS AND METHOD FOR ANALYSIS OF RTL STRUCTURES THAT CAUSE PHYSICAL CONGESTION

(71) Applicant: Atrenta, Inc., San Jose, CA (US)

(72) Inventors: Ravi Varadrajan, Fremont, CA (US); Jitendra Gupta, Pleasanton, CA (US); Priyank Mittal, Ghaziabad (IN); Tapeesh Gupta, Delhi (IN); Navneet Mohindru, San Jose, CA (US)

(73) Assignee: Atrenta, Inc., San Jose, CA (US)

( * ) Notice: Subject to any disclaimer, the term of this patent is extended or adjusted under 35 U.S.C. 154(b) by 0 days.

(21) Appl. No.: 13/952,024

(22) Filed: Jul. 26, 2013

Related U.S. Application Data

(60) Provisional application No. 61/780,986, filed on Mar. 14, 2013.

(51) Int. Cl.
*G06F 17/50* (2006.01)

(52) U.S. Cl.
USPC ............ 716/135; 716/101; 716/106; 716/136

(58) Field of Classification Search
USPC ................................. 716/101, 106, 135–136
See application file for complete search history.

(56) References Cited

U.S. PATENT DOCUMENTS

| | | | |
|---|---|---|---|
| 5,541,849 A * | 7/1996 | Rostoker et al. ............. | 716/102 |
| 6,068,662 A | 5/2000 | Scepanovic et al. | |
| 6,651,225 B1 * | 11/2003 | Lin et al. ....................... | 716/113 |
| 6,668,365 B2 | 12/2003 | Harn | |
| 6,725,432 B2 * | 4/2004 | Chang et al. .................. | 716/132 |
| 6,813,201 B2 * | 11/2004 | Zarrineh et al. ............. | 365/201 |
| 7,082,584 B2 | 7/2006 | Lahner et al. | |
| 7,114,142 B1 | 9/2006 | Segal et al. | |
| 7,146,586 B2 * | 12/2006 | Bohl et al. ..................... | 716/136 |
| 7,162,703 B1 * | 1/2007 | Aik .............................. | 716/106 |
| 7,225,116 B2 | 5/2007 | Harn | |
| 7,243,320 B2 * | 7/2007 | Chiu et al. .................... | 716/106 |
| 7,260,808 B1 * | 8/2007 | Pasqualini .................... | 716/104 |
| 7,299,442 B2 | 11/2007 | Alpert et al. | |
| 7,299,446 B2 * | 11/2007 | He et al. ....................... | 716/103 |
| 7,383,521 B2 * | 6/2008 | Smith et al. .................. | 716/114 |
| 7,401,313 B2 | 7/2008 | Galatenko et al. | |
| 7,458,046 B2 * | 11/2008 | Ghosh et al. ................. | 716/106 |
| 7,707,526 B2 * | 4/2010 | Su et al. ........................ | 716/136 |
| 7,886,241 B2 * | 2/2011 | Bohl et al. .................... | 716/136 |
| 7,890,916 B1 * | 2/2011 | Donlin et al. ................ | 716/116 |
| 7,971,174 B1 | 6/2011 | Khalsa et al. | |
| 8,024,693 B2 | 9/2011 | Adams et al. | |
| 8,037,437 B2 * | 10/2011 | Davis et al. ................... | 716/113 |
| 8,091,050 B2 * | 1/2012 | Bose et al. .................... | 716/100 |
| 8,108,809 B2 | 1/2012 | Sadakane et al. | |
| 8,122,420 B1 | 2/2012 | Kannan et al. | |
| 8,146,035 B1 * | 3/2012 | Schumacher et al. ........ | 716/109 |
| 8,185,858 B2 | 5/2012 | Okamoto | |
| 8,239,797 B1 | 8/2012 | Ghosh et al. | |
| 8,250,512 B2 | 8/2012 | Lo et al. | |
| 8,370,783 B2 | 2/2013 | Uchino et al. | |
| 2005/0268258 A1 * | 12/2005 | Decker ........................... | 716/4 |
| 2010/0083203 A1 * | 4/2010 | Bose et al. ...................... | 716/6 |

* cited by examiner

*Primary Examiner* — Naum Levin
(74) *Attorney, Agent, or Firm* — Thomas Schneck; Mark Protsik

(57) ABSTRACT

A logical congestion metric analysis engine predicts pre-placement routing congestion of integrated circuit designs. The engine uses a method employing new congestion-predicting metrics derived from structural register transfer level (RTL). The method compares multiple metrics to those stored in a knowledge base to predict routing congestion. The knowledge base contains routing results for multiple designs using the same technology. For each design the knowledge base holds pre-placement metric values and the corresponding post-placement and routing congestion results. A logical congestion debug tool allows users to visualize and fix congestion issues.

19 Claims, 8 Drawing Sheets

EFFICIENT APPARATUS AND METHOD FOR ANALYSIS OF RTL STRUCTURES THAT CAUSE PHYSICAL CONGESTION

CROSS-REFERENCE TO RELATED APPLICATION

This application claims priority under 35 U.S.C. 119(e) from prior U.S. provisional application No. 61/780,986, filed Mar. 14, 2013.

TECHNICAL FIELD

This invention relates to the analysis of integrated circuit (IC) designs for routing congestion likelihood. The invention specifically relates to analysis of a structural design before the floor planning, placement and routing steps of a typical IC implementation flow.

BACKGROUND ART

The physical implementation of integrated circuit (IC) designs developed using Hardware Description Languages (HDL) such as Verilog and VHDL, is a tedious, effort and time-intensive process. The main IC design development steps are typically high-level architecture definition, register transfer level (RTL) code development, functional verification, synthesis and timing optimization, floorplanning, cell placement and timing optimization, routing and final verification. If a design is unable to successfully complete routing it is considered a routing congestion failure.

The design team attempts to resolve a routing congestion failure using a combination of methods: (i) decrease the design utilization, i.e., implement the block with larger silicon area; (ii) change the floorplan to allocate more area for the affected block, often causing a sub-optimal floorplan and degradation in design performance; and (iii) change the design itself by changing the design's HDL description. Each of the methods creates a significant loss in terms of increased time to design implementation completion, time to market for the finished product, larger silicon area, reduced performance and clock frequency, risk of not fitting into chosen chip package, and higher development cost.

Given the high cost of resolving routing congestion, a method to predict routing congestion at the pre-floorplan stage of design development is very valuable to design development teams. By predicting routing congestion early in the development cycle, the development team can take corrective steps before going to physical implementation, and hence significantly reduce risk to timely completion and overall cost of development.

SUMMARY DISCLOSURE

Accordingly a method implemented in a computing system is provided for analyzing register-transfer-level structures of a pre-floorplan integrated circuit design to predict routing congestion. The computing system including at least one processing unit, a knowledge base accessible by the processing unit, and a memory accessible by the processing unit is also provided. The knowledge base contains a statistically sufficient set of empirical routing congestion results for multiple circuit designs in at least one process technology, the routing congestion results in the knowledge base being accessible according to a set of one or more metric values. The memory stores a hardware description of at least a portion of the circuit design. The memory also stores a set of program instructions of a logical congestion metric analysis engine that when executed by the processing unit causes the system to perform the method.

The method begins by receiving a hardware description of at least a portion of the circuit design. Next, a logical congestion metric analysis of the received circuit design is performed to obtain one or more congestion-predicting metric values therefrom. For example, the logical congestion metric analysis of the received circuit design may compute a set of raw metrics from the hardware description and then one or more derived metrics from the raw metrics, including combination metrics computed from weighted combinations of any one or more of the raw metrics, timing criticality metrics and placement criticality metrics, as well as metrics that are computed from statistical distributions of any of the raw metrics and the combination metrics, such as any one or more of peak and average of a raw or combination metric, a metric value defining a top N % of logic cells in the design, and number or percent of logic cells in the design within a specified metric value range or interval.

The knowledge base is accessed according to the obtained one or more metric values, thereby obtaining congestion results for a circuit design of the same processing technology determined to have the closest metric values to the one or more obtained metric values. The closest metric value in the knowledge base may be determined, for example, from a least sum of metric differences squared for a selected set of metric values.

The obtained congestion results for the analyzed circuit design are reported. Congestion results reported from the database may include a congestion routing severity for every module in the received hardware description of the circuit design, the severity determined from a selected congestion rule. Congestion results may further include any one or more of identification of wide-and-deep multiplexers, nets with higher fan-out than a specified threshold, cones of logic with a fan-in or a fan-out wider than a specified threshold, and identification of any critical objects. The congestion results can be reported as a display of module instances at different levels of design hierarchy with a graphical indication of routing congestion for each module in the received hardware description of the circuit design.

DETAILED DESCRIPTION

A logical congestion metric analysis engine predicts pre-placement routing congestion of integrated circuit designs. The engine uses a method employing new congestion-predicting metrics derived from a structural register transfer level (RTL) design. The method compares multiple metrics to those stored in a knowledge base to predict routing congestion. The knowledge base contains routing results for multiple designs using the same technology. For each design the knowledge base holds pre-placement metric values and the corresponding post-placement and routing congestion results. A logical congestion debug tool allows users to visualize and fix congestion issues.

Figure 1:
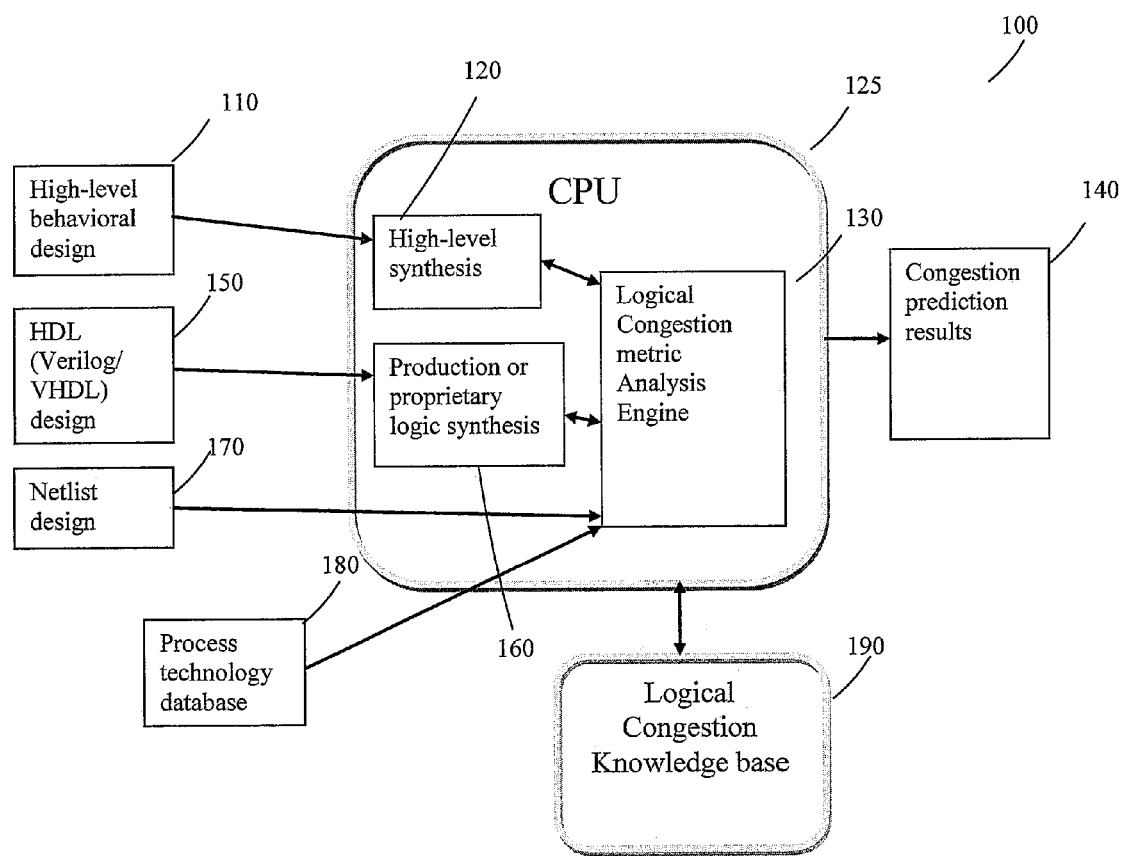
FIG. 1 shows a Logical Congestion Metric Analysis Engine.

FIG. 1 is an exemplary and non-limited diagram showing a Logical Congestion Metric Analysis Engine (LCMAE), 130 in an electronic design automation (EDA), system. The LCMAE 130 runs on a central processing unit (CPU), 125. The LCMAE 130 accepts a pre-floorplan structural design file that resides on a storage device such as disk drive or in a memory. The pre-floorplan structural design file can be created by a high-level synthesis tool 120 from a high-level behavioral design, 110. The pre-floorplan structural design file can alternatively be created by a production or proprietary logic synthesis tool 150 from a HDL (e.g., Verilog/VHDL) design, 160. The pre-floorplan structural design file can alternatively be a netlist design created by other means. The high-level synthesis tool 120 and the production or proprietary logic synthesis tool 150 run on a CPU. The LCMAE 130 accepts integrated circuit (IC) process technology parameters from a process technology database, 180. The process technology database 180 includes standard cell delay times and parameters for determining the critical timing paths. The process technology database 180 also includes metal layer information indicating the routing resources available at each metal layer for the given process technology.

The LCMAE 130 interacts with a Logical Congestion Knowledge base, 190. The Logical Congestion Knowledge base 190 is implemented as a database and stored on a storage device such as a disk drive. The LCMAE 130 queries the Logical Congestion Knowledge base 190 searching for designs with similar metric values. The LCMAE 130 produces congestion prediction results 140 which are normally stored on a storage device such as a disk drive. The congestion prediction results 140 are stored in a database and used to create a report. The Logical Congestion Knowledge base 190 contains a statistically sufficient sample of multiple designs and technology process nodes with pre-floorplan metrics and actual post place and route routing congestion Values. The Logical Congestion Knowledge base 190 is designed to be flexible with the expectation that new pre-floorplan metrics will be discovered. The Logical Congestion Knowledge base 190 stores sufficient design information to be able to compute and save new pre-floorplan metrics values.

Figure 2:
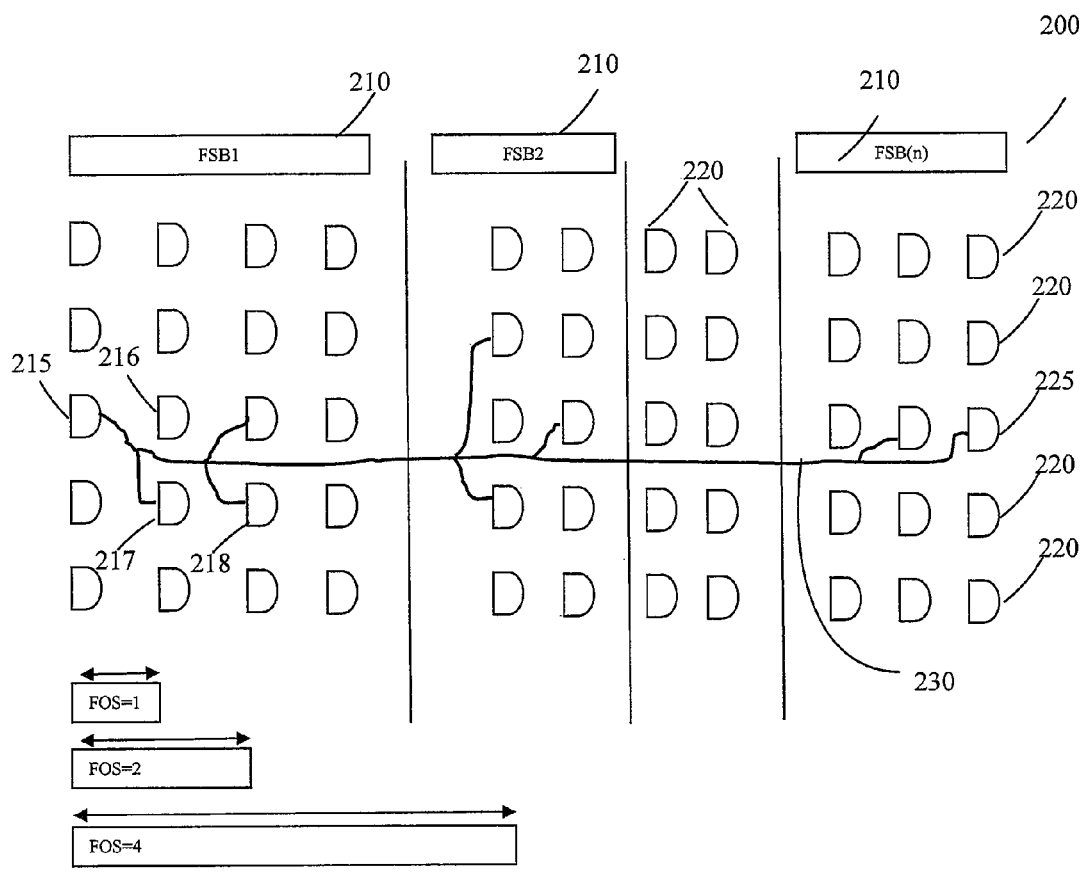
FIG. 2 shows logic gates within a levelized circuit.

FIG. 2 shows logic gates, 215, 216, 217, 218, 220, and 225, within a levelized circuit and illustrates the fanout span depth (FOSD) metrics. Levelizing a circuit means arranging the logic gates according to their connectivity. The logic gates, 215, 220 and 225, are arranged into vertical columns according to their FOSDs. The span depth reflects the longest path between logic gates at different depths. Net 230 connects a logic gate, 215, to logic gate, 225, as well as other logic gates. Logic gate 225 is at FOSD 10 with respect to logic gate 215. Fanout span buckets (FSBs) 210 define a range of FOSD values. In FIG. 2, FSB1 represents a FOSD of 3 or less and FSB2 represents a FOSD of 4 to 5. FOSD metrics have three values per FSB: count, average and maximum. The count value is the number of directly connected logic cells within the FSB. The average value is the average FOSD value of directly connected logic cells within the FSB. The maximum value is the maximum FOSD value of directly connected logic cells within the FSB. The target logic gate 215 connects to three other logic gates within the FSB1 bucket. The three connected logic gates 216, 217, and 218 are at span depths 1, 2 and 2 respectively. For target logic gate 215 and FSB1 210, the FOSD metric values are: count=3, average=(1+2+2)/3, and maximum=2. Global nets such as clock signals and reset signals are excluded from this analysis.

The LCMAE 130 distinguishes between special cells and well-behaved cells. Special cells include primary inputs, primary outputs, black-boxes (models for missing logic) and hard macros (logic different from the synthesizable RTL or gate-level description). Well-behaved cells are standard logic cells that don't fall into the special cell category. The FOSD metrics are only computed for well-behaved cells and only count connections to other wellbehaved cells. The fanout-span-depth-specialcells (FOSDS) metrics are like the FOSD metrics except that they count connections to special Cells instead of well-behaved cells.

Fanin-span-depth (FISD) metrics are similar to the FOSD metrics but apply to the fanin of a logic cell. FISD has count, average and maximum values for each fanin span buckets. The FISD metrics are only computed for well-behaved cells and only count connections to well-behaved cells. The fanin-span-depth-specialcells (FISDS) metrics are like the FISD metrics except that they count connections to special cells instead of well-behaved cells.

Figure 3:
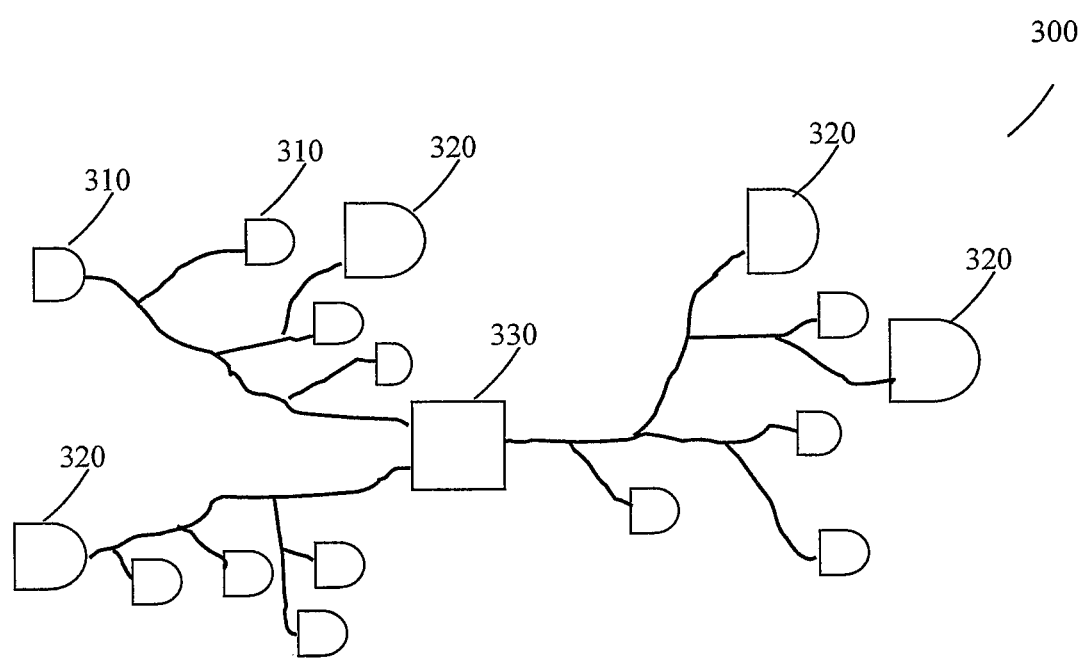
FIG. 3 shows special cells and well-behaved cells.

FIG. 3 shows well-behaved and special cells to illustrate the high-neighbor-distribution-dist (HNDD) metric. The HNDD metric counts connections to both special cells and to well-behaved cells. The HNDD metrics count the total number of wellbehaved cell connections, the number of special cell connections, the average well-behaved cell connections per terminal and the average special cell connections per terminal. The number of terminals is the number of connections to a logic cell. The HNDD-1 metric refers to adjacent connections, i.e.; at distance 1. The HNDD-N metric refers to connections at distance N. The HNDD metrics are only computed for well-behaved cells. In FIG. 3 the target logic cell 330 connects to 12 well-behaved cells, 310, and 4 special cells, 320. The target logic cell 330 has two input nets and one output net which means it has a total of 3 connection terminals. The target logic cell 330 has 4 HNDD-1 metric values. These are: total neighbors=12, special neighbors=4, average neighbors per terminal=4 and average special neighbors per terminal=1.33. Global nets such as clock and reset are excluded from this analysis.

FOSD, FISD, FOSDS, FISDS, and HNDD-X metrics are computed for every well-behaved cell in the circuit. We call these raw metrics. Timing criticality and placement criticality are other types of metric. All these metrics are indicators of routing congestion. Combination metrics are computed from one or more raw metrics, a timing criticality metric and a placement criticality metric. Combination metrics are for every well-behaved cell in the circuit. In one embodiment metrics are also applied to nets and special cells.

Logic modules are characterized by derived metrics. The derived metrics are computed from the raw and combination metrics of the well-behaved cells in the module. The derived metric are used to search the Logical Congestion Knowledge base 190.

Figure 4:
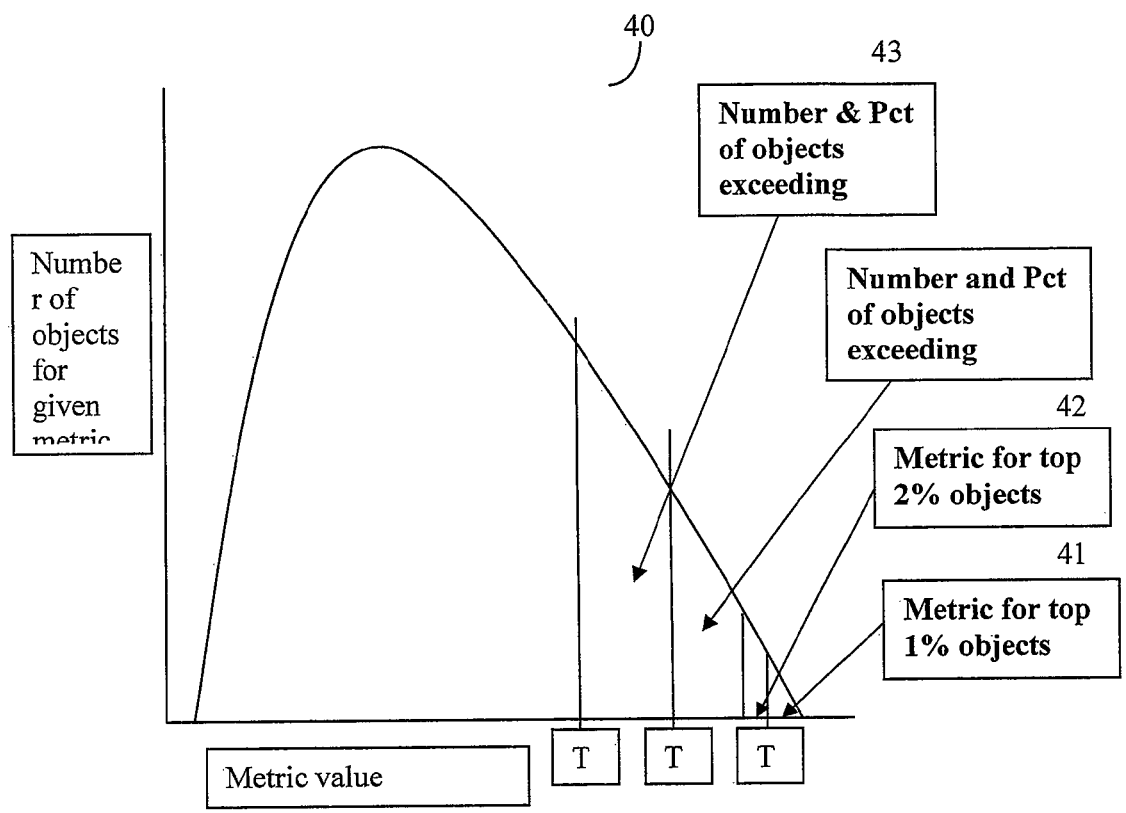
FIG. 4 shows a histogram for the frequency distribution of metric values.

FIG. 4 shows an exemplary and non-limiting histogram for the frequency distribution of metric values and illustrates some of the derived metrics. Some derived metrics are computed from the statistical distribution of the raw metrics and combination metrics. The vertical axis represents the number of logic cells that have a specific range of metric values. The horizontal axis represents ascending metric values. The histogram is generated by dividing the range of metric values into multiple intervals and counting how many logic cells' values are within each interval. For some metrics a logarithmic scale is used. One of the derived metrics is the one-percent metric. The one-percent metric is the metric value such that one percent of the logic cells have a higher metric value than this one-percent metric value.

In FIG. 4 the metric value, T3, defines the top 1% of the distribution, 410. Other derived metrics are the number and percentage of logic cells with value within a specified range. In FIG. 4 the number and percentage of logic cells with metric value between T1 and T2, is shown as the area 430.

Figure 5:
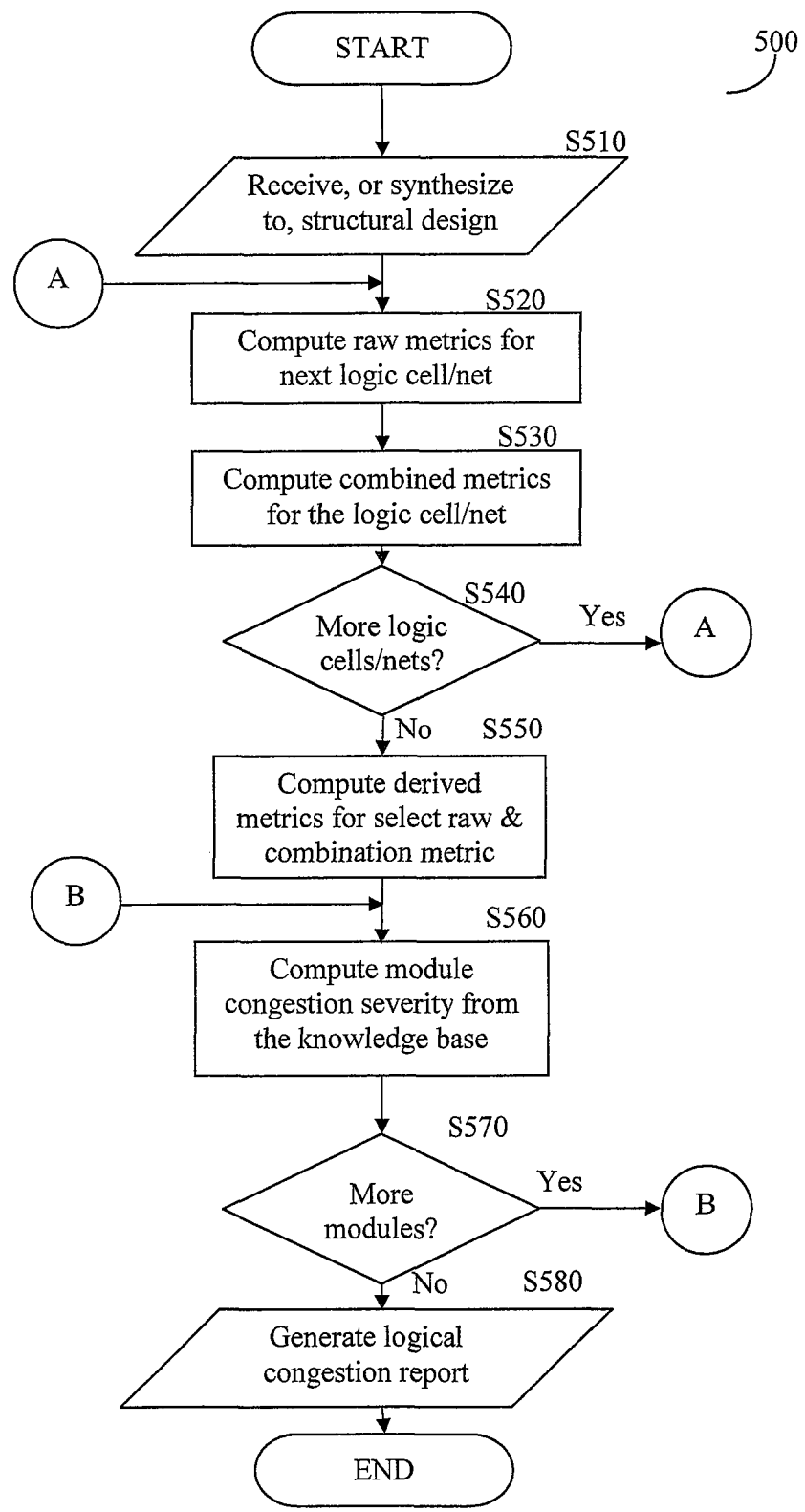
FIG. 5 shows a flowchart for determining pre-floorplan routing congestion.

FIG. 5 is an exemplary and non-limited flowchart for determining pre-floorplan routing congestion. In S510 the LCMAE 130 receives a structural design 170 or synthesizes a structural design from a design file, 110 or 150.

In S520, S530 and S540 the LCMAE 130 computes congestion metrics for all logic cells and nets within the design file. In S520 the LCMAE 130 processes the first logic cell or net. On subsequent iterations S520 processes the next logic cell or net. S520 computes raw metrics for the current logic cell or net. Raw metrics include FOSD, FISD, FOSDS, FISDS, and HNDD.

In one embodiment of the invention, the LCMAE 130 computes metrics for a statistically sufficient subset of the well-behaved logic cells and nets within the design file. This reduces the analysis time.

In S530 the LCMAE 130 computes combined metrics. The LCMAE 130 computes zero or more combination metrics by adding weighted combinations of raw metrics, a timing-criticality metric, and a placement-criticality metric. A logic cell's or net's timing-criticality is determined from a timing analysis of the full circuit. The LCMAE 130 determines timing critical paths by looking at logic depth, logic cell delays, fanout, fanin and end-user-specified timing constraints. A logic cell's or net's placement criticality is determined from a user-defined constraint or its logic level distance from a user-defined constraint object. In S540 the LCMAE 130 checks if there are more logic cells or nets to process, If there are more logic cells or nets execution continues at S520; otherwise, execution continues with S550.

In S550 the LCMAE 130 computes derived metrics. Derived metrics include peak and average of a raw or combined metric. Derived metrics further include the metric value that defines the top 1% or top N % of logic cells. Derived metrics further include the number and percent of logic cells that have metric value within a range.

In S560 and S570 the LCMAE 130 computes congestion severity for every module in the design. In S560 the LCMAE 130 processes the first module on the first iteration and subsequent modules on subsequent iterations. In 5560 the LCMAE 130 searches the Logical Congestion Knowledge base 190 looking for designs with similar derived metric values. In one embodiment the LCMAE 130 selects the design with closest derived metric Values. The LCMAE 130 uses the sum of the metric differences squared to measure the degree of match. In S560 the LCMAE 130 assigns the module the congestion severity factor from the closest design in the Logical Congestion Knowledge base, 190. In S570 the LCMAE 130 checks if there are more modules to process. If it finds more modules execution continues at S560; otherwise execution continues with S580.

In S580 the LCMAE 130 generates a logical congestion report. The results may further be stored in a congestion prediction results file 140.

The LCMAE 130 may use different numbers and/or different accuracy of metrics to control the software execution time at the expense of prediction accuracy. For example, to get a faster execution time the LCMAE 130 can use only two fanout and fanin span buckets and compute HNDD for only distance 1.

Figure 6:
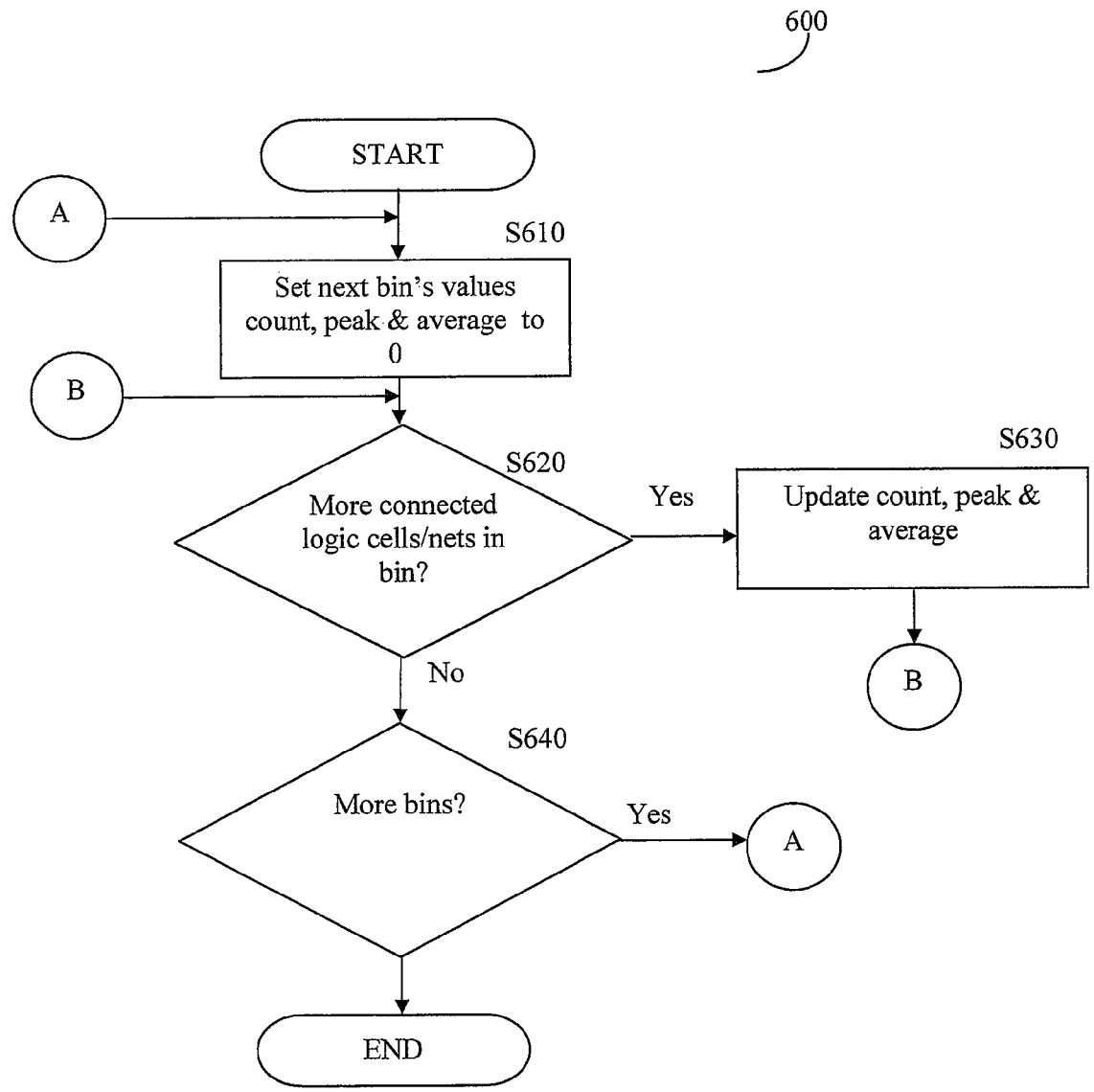
FIG. 6 shows a flowchart for determining span depth and neighbor distribution metrics.

FIG. 6 is an exemplary and non-limited flowchart for determining span depth and neighbor distribution metrics. This flowchart applies to metrics FOSD, FISD, FOSDS, FISDS, and HNDD. This flowchart applies to a well-behaved logic cell. S610, S620, S630 and S640 are applied to multiple depth bins. For the HNDD metric the depth bins are the distances of neighbors. For the other metrics, the depth bins are the fanout span bins (FSBs) 210 or fanin span bins. In S610 the LCMAE 130 initializes the metric values of count, average and maximum to zero. In S620 and S630, the LCMAE 130 processes all the connecting logic cells and nets. In S620 the LCMAE 130 checks if there are any more connecting logic cells and nets to process. If there are more cells and nets execution continues at S630; otherwise execution continues with S640. In S630 the LCMAE 130 updates the count, average and maximum metric of the bin. For the HNDD metric the LCMAE 130 counts the special cells and well-behaved cells separately. For the HNDD metric the LCMAE 130 computes the average as the number of connections per terminal. For the other metrics the LCMAE 130 computes the average span-depth. In S640 the LCMAE 130 checks if there are more depth bins to process, If there are more depth bins the LCMAE 130 continues at S610, otherwise it stops.

Figure 7:
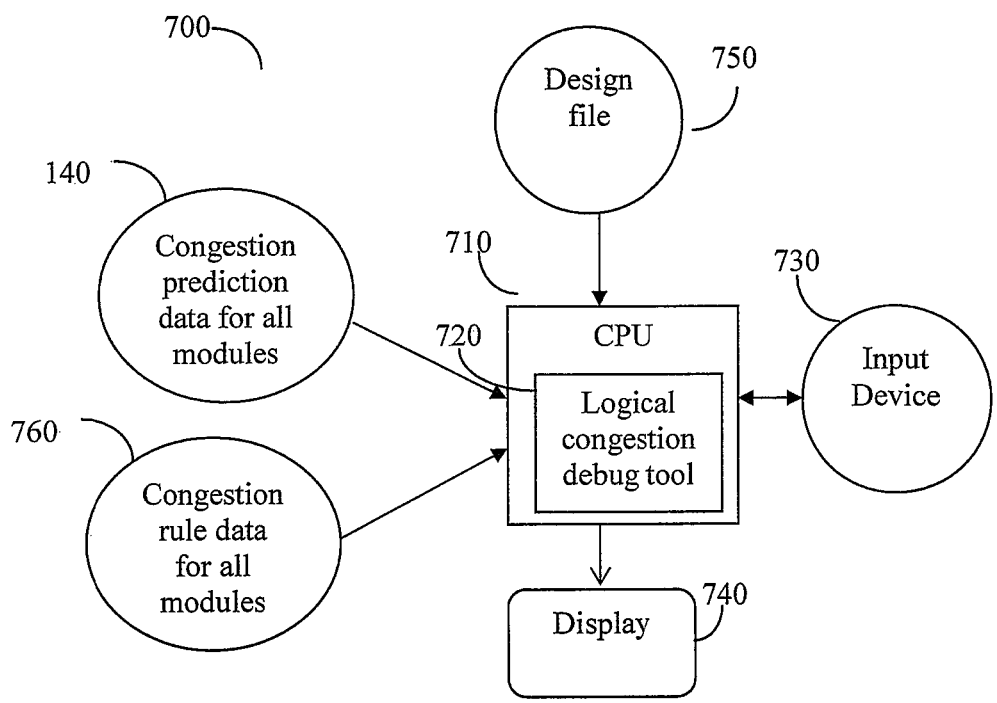
FIG. 7 shows a logical congestion debug tool.

FIG. 7 is an exemplary and non-limited diagram showing a Logical Congestion Debug tool (LCDT) 720 in an EDA system. The LCDT 720 allows logic designers to view routing congestion results, view causes of routing congestion and view gate-level schematics. The LCDT 720 runs on a CPU 710. The LCDT 720 reads congestion prediction results 140 from a storage medium. In one embodiment the LCMAE 130 generates the congestion prediction results 140. The congestion prediction results 140 identify a routing congestion severity for every module in the design. In one embodiment congestion prediction results 140 includes an internal routing congestion severity and a peripheral routing congestion severity. The peripheral routing congestion severity can be computed used well-known techniques, e.g., using Rent's rule. Rent's rule states that the number of terminals of an IC, T, are related to the number of logic gates, g. Specifically, log(T)=k*log(g), where k is a constant. Peripheral congestion can be estimated by the ratio of log(g) to log(T). The LCDT 720 interacts with a logic designer using an input device, 730 and a display, 740. The LCDT 720 reads a structural design file, 750 and congestion rule data, 760. The congestion rule data 760 resides on a storage medium and identifies rules that have been applied to the design. The congestion rule data 760 includes rule checking results on logic cells and modules.

Figure 8:
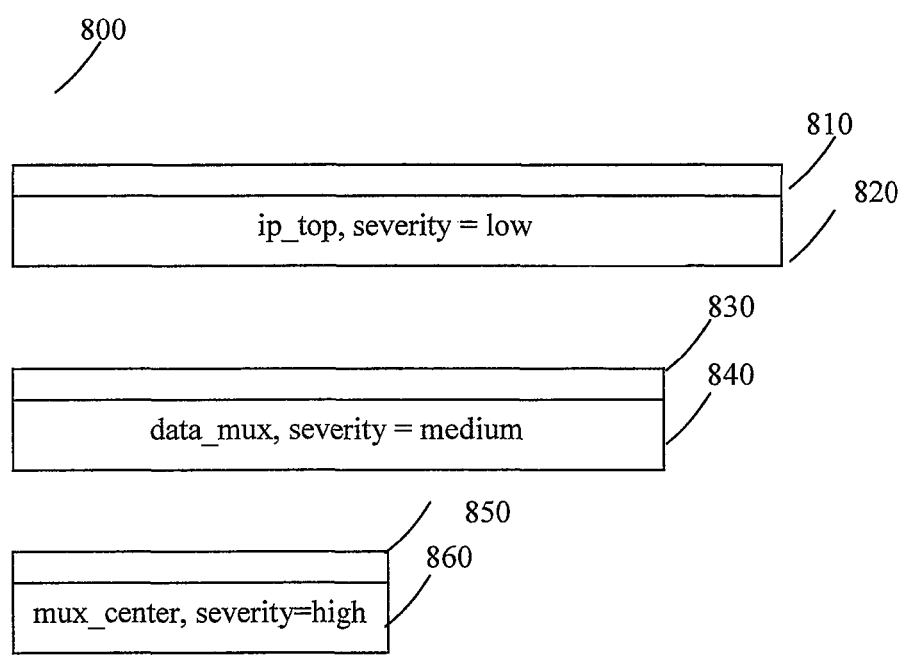
FIG. 8 shows routing congestion as depicted by a logical congestion debug tool.

FIG. 8 is an exemplary and non-limited diagram showing how the LCDT 720 shows routing congestion severity graphically on a display. The LCDT 720 shows modules with routing congestion severity that exceed a threshold. FIG. 8 displays module instances at different levels of design hierarchy. Each module is represented by a rectangle with a stripe at the top. The module name and internal routing congestion severity is shown in the main, lower part of each rectangle. The top stripe is used to indicate peripheral routing congestion. In FIG. 8 the top-level module in the design hierarchy is represented by a rectangle comprised of 810 and 820. The lower part of this rectangle, 820 shows the module name ip_top and an internal routing severity of low. The peripheral routing congestion stripe 810 is used to indicate, peripheral routing congestion. The lowest-level module in the design hierarchy represented by 850 and 860 has name mux center and an internal routing severity of high. Each box in the display, 810-860, indicates a routing congestion severity for a logical module instance. In one embodiment the boxes are color-coded to indicate severity. The top rows, 810, 830, 850 indicate the peripheral routing congestion for the respective logical module instance. The lower rows, 820, 840, and 860 indicate the internal routing congestion for the respective logical module instance. The width of each box represents the module size in terms of standard cell instance count.

There are two broad cause of congestion:
1. Internal congestion caused by RTL synthesizable logic contained within the current module or any of the child modules within the current module hierarchy.
2. Peripheral congestion in one or more child module instances causing internal congestion at the next level of hierarchy.

The LCDT 720 reads the congestion rule data 760 to report RTL constructs that cause internal congestion. Some common examples of Congestion rules are listed below:
a) LargeMux structures are detected by PHY_LargeMux rule. This rule identifies wide-and-deep multiplexers (muxes) that have high intrinsic complexity and contribute to congestion in their parent module.
b) High Fanout nets are reported by PHY_Fanout rule. The report highlights non-ideal nets that have a higher fanout than specified threshold.
c) High Fanin Cones of Logic are reported by PHY_FaninCone rule. The report highlights very wide cones of logic that lead to congestion. Wide mux structures and some datapath structures are often found within such wide cones. Registers, Primary Inputs and Hard-Macro instance terminals are considered as Valid start-points for computing the fanin cone.
d) High Fanout Cones of logic are reported by PHY_FanoutCone rule. The report highlights forward logical propagation span of registers and Primary Inputs.
e) Critical objects report is generated by PHY_CriticalObjects rule. The report highlights registers which have significant overlap of logic depth, fanin cone, fanout cone and presence of LargeMux instances in their fanin/fanout cone.
f) Cell Pin Density report reports the standard cell profile of technology library cells used during synthesis and technology mapping of current RTL module (including the logical hierarchy contained within).

The LCDT 720 allows logic designers to select a congested module and display failing rules that apply to the selected module.

The LCDT 720 allows logic designers to view a gate-level schematic of a module to visualize the density of nets. This may help a logic designer understand the cause of peripheral congestion.

The embodiments disclosed herein can be implemented as hardware, firmware, software, or any combination thereof. Moreover, the software is preferably implemented as an application program tangibly embodied on a program storage unit or computer readable medium. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

In one embodiment of the invention the teachings herein may be integrated as part of a computer aided design (CAD) system and/or tool.

What is claimed is:

1. A method implemented in a computing system for analyzing register-transfer-level structures of a pre-floorplan integrated circuit design to predict routing congestion, comprising:
   receiving, using a computer, a hardware description of at least a portion of the circuit design;
   performing, using the computer, a logical congestion metric analysis of the received circuit design to obtain one or more congestion-predicting metric values therefrom, the logical congestion metric analysis including deriving multiple raw metrics from the hardware description and computing one or more derived metrics from the set of raw metrics;
   accessing by the computer, according to the obtained one or more metric values, a knowledge base containing a statistically sufficient set of empirical routing congestion results for multiple circuit designs in at least one process technology, the accessing of the knowledge base thereby obtaining congestion results for a circuit design of the same processing technology determined to have the closest metric values to the one or more obtained metric values; and
   reporting, by the computer, the obtained congestion results for the analyzed circuit design.

2. The method as in claim 1, wherein the raw metrics are selected from one or more of: fan-out span depth (FOSD) metrics for well-behaved cells in the design, fan-in span depth (FISD) metrics for well-behaved cells in the design, fan-out span depth special cell (FOSDS) metrics for special-cells in the design, fan-in span depth special-cells (FISDS) metrics for special cells in the design, and high-neighbor-distribution-distance (HNDD) metrics for connections at various distances X for well-behaved cells in the design.

3. The method as in claim 2, wherein derived metrics include metrics that are computed from statistical distributions of any of the raw metrics and the combination metrics, including any one or more of peak and average of a raw or combination metric, a metric value defining a top N % of logic cells in the design, and number or percent of logic cells in the design within a specified metric value range or interval.

4. The method as in claim 1, wherein a circuit design having a closest metric value in the knowledge base is determined from a least sum of metric differences squared for a selected set of metric values.

5. The method as in claim 1, wherein the congestion results include a congestion routing severity for every module in the received hardware description of the circuit design, the severity determined from a selected congestion rule.

6. The method as in claim 5, wherein the congestion results include any one or more of identification of wide-and-deep multiplexers, nets with higher fan-out than a specified threshold, cones of logic with a fan-in or a fan-out wider than a specified threshold, and identification of any critical objects.

7. The method as in claim 1, wherein the congestion results are reported as a display of module instances at different levels of design hierarchy with a graphical indication of routing congestion for each module in the received hardware description of the circuit design.

8. The method as in claim 1, wherein the method uses different numbers and/or different accuracy of metrics to control the software execution time at the expense of prediction accuracy.

9. A method as in claim 1 where some of the metrics are derived from the levelized-circuit, span-depth of connected components.

10. A method as in claim 1 where some of the metrics are derived from the numbers of connected logic-gates and/or connected special-cells at different depths.

11. A computing system for analyzing register-transfer-level structures of a pre-floorplan integrated circuit design to predict routing congestion, comprising at least one processing unit, a knowledge base accessible by the processing unit, and a memory accessible by the processing unit, the memory storing a hardware description of at least a portion of the circuit design, the memory also storing a set of program instructions of a logical congestion metric analysis engine that when executed by the processing unit causes the system to:
- perform a logical congestion metric analysis of the stored circuit design to obtain one or more congestion-predicting metric values therefrom;
- access the knowledge base according to one or more of the obtained metric values to obtain congestion results for a circuit design of the same processing technology with the closest metric values to the one or more obtained metric values, the knowledge base containing a set of empirical routing congestion results for multiple circuit designs in at least one process technology, the routing congestion results in the knowledge base being accessible according to a set of one or more metric values; and
- report the obtained congestion results for the analyzed circuit design.

12. The system as in claim 11, wherein the logical congestion metric analysis of the received circuit design includes computing a set of raw metrics from the hardware description and then computing one or more derived metrics from the raw metrics, the knowledge base being accessed according to at least one of the derived metrics.

13. The system as in claim 12, wherein the raw metrics are selected from one or more of: fan-out span depth (FOSD) metrics for well-behaved cells in the design, fan-in span depth (FISD) metrics for well-behaved cells in the design, fan-out span depth special cell (FOSDS) metrics for special-cells in the design, fan-in span depth special-cells (FISDS) metrics for special cells in the design, and high-neighbor-distribution-distance (HNDD) metrics for connections at various distances X for well-behaved cells in the design.

14. The system as in claim 12, wherein the derived metrics include combination metrics computed from weighted combinations of any one or more of the raw metrics, timing criticality metrics and placement criticality metrics.

15. The system as in claim 14, wherein derived metrics include metrics that are computed from statistical distributions of any of the raw metrics and the combination metrics, including any one or more of peak and average of a raw or combination metric, a metric value defining a top N % of logic cells in the design, and number or percent of logic cells in the design within a specified metric value range or interval.

16. The system as in claim 11, wherein a circuit design having a closest metric value in the knowledge base is determined from a least sum of metric differences squared for a selected set of metric values.

17. The system as in claim 11, wherein the congestion results include a congestion routing severity for every module in the received hardware description of the circuit design, the severity determined from a selected congestion rule.

18. The system as in claim 17, wherein the congestion results include any one or more of identification of wide-and-deep multiplexers, nets with higher fan-out than a specified threshold, cones of logic with a fan-in or a fan-out wider than a specified threshold, and identification of any critical objects.

19. The system as in claim 11, wherein the congestion results are reported as a display of module instances at different levels of design hierarchy with a graphical indication of routing congestion for each module in the received hardware description of the circuit design.

* * * * *